United States Patent [19]
Chang et al.

[11] Patent Number: 5,024,965
[45] Date of Patent: Jun. 18, 1991

[54] MANUFACTURING HIGH SPEED LOW LEAKAGE RADIATION HARDENED CMOS/SOI DEVICES

[76] Inventors: Chen-Chi P. Chang, 2515 Alta Vista Dr., Newport Beach, Calif. 92660; Mei Li, 26572 Loma Verde, Mission Viejo, Calif. 92691

[21] Appl. No.: 481,148

[22] Filed: Feb. 16, 1990

[51] Int. Cl.$^5$ .......................................... H01L 21/336
[52] U.S. Cl. ........................................ 437/57; 437/26; 437/62; 437/67; 437/84; 437/240; 437/982; 148/DIG. 150; 148/DIG. 133
[58] Field of Search ...................... 437/84, 44, 45, 982, 437/60, 62, 26, 67, 57; 148/DIG. 150, DIG. 133; 357/23.7, 23.11

[56] References Cited

U.S. PATENT DOCUMENTS

| 4,091,527 | 5/1978 | Goodman et al. | 437/84 |
| 4,097,314 | 6/1978 | Schlesier et al. | 437/84 |
| 4,199,384 | 4/1980 | Hsu | 437/84 |
| 4,199,773 | 4/1980 | Goodman et al. | 437/84 |
| 4,463,492 | 8/1984 | Maeguchi | 437/84 |
| 4,494,996 | 1/1985 | Ohno et al. | 148/DIG. 150 |
| 4,755,481 | 7/1988 | Faraone | 437/62 |

FOREIGN PATENT DOCUMENTS 55-75238  6/1980  Japan .................................. 437/84

OTHER PUBLICATIONS

Abbas, S. A. et al., "Silicon-On-Sapphire . . . ", *IBM Technical Disclosure Bulletin*, vol. 16, No. 3, Aug. 1973, pp. 1027-1029.

*Primary Examiner*—Brian E. Hearn
*Assistant Examiner*—T. N. Quach
*Attorney, Agent, or Firm*—Terje Gudmestad; W. K. Denson-Low

[57] ABSTRACT

A method of fabricating high speed, low leakage, radiation hardened integrated circuit semiconductor devices. In accordance with the method a SIMOX (separation by ion implantation of oxygen) wafer is masked with a separation mask to form silicon islands. The separation mask forms groups of N-channel and P-channel devices that are isolated from each other. The N- and P-channel device separation assists in preventing device latch-up. N- and N-channel devices are isolated by controlling the process due to high field inversion thresholds and radiation hardened field oxide to eliminate any channel-to-channel leakage current after high dosage irradiation. A relatively thin gate oxide layer is formed over the islands, and the island edges are covered with phosphoroborosilicate glass deposited at a relatively low temperature (850° C.) to eliminate sharp island edges and hence edge leakage. The use of SIMOX substrate materials, phosphoroborosilicate glass and thin oxide provides the benefits of improved speed and reduced leakage due to intrinsic oxide isolation, shallow wells and source and drain junctions. The use of a thin thermal oxide layer and phosphoroborosilicate glass eliminates the edge leakage and channel-to-channel leakage upon high dosage irradiation, thus providing improved radiation hardness. The method of the present invention provides for devices having stable field behavior after irradiation. The method produces radiation hardened devices that exhibit high speed and reliability and which are stable when irradiated with up to a 10 MRad dosage level.

20 Claims, 3 Drawing Sheets

MANUFACTURING HIGH SPEED LOW LEAKAGE RADIATION HARDENED CMOS/SOI DEVICES

BACKGROUND

The present invention relates to methods of manufacturing semiconductor devices and in particular to a method for producing high speed, low-leakage, radiation hardened CMOS/SOI semiconductor devices.

Various military and commercial applications of semiconductor devices use the devices in environments where they are or may become exposed to radiation. For example, communications equipment carried an orbiting satellite may be exposed to high levels of radiation. Radiation exposure may also occur when the devices are employed in nuclear environments such as in nuclear power plants and medical equipment utilizing radioactive materials. Conventional semiconductor devices exposed to such radiation may be destroyed or at a minimum rendered inoperative.

The use of bulk silicon to fabricate radiation hardened devices results in latch-up, well and junction depth control problems and field inversion threshold voltage control problems. To overcome these problems, methods have been devised to produce radiation hardened semiconductor devices. One such method uses silicon on insulator (SOI) materials as a substrate on which the semiconductor devices are fabricated. Methods utilizing this material exhibit the benefits of intrinsic isolation of devices on a single semiconductor chip, absence of parasitic bipolar paths, and reduced active carrier generation in a radiation environment. With this method, N- and P-channel devices are fabricated by means of a silicon etching procedure to form islands. The disadvantage of this method is that polysilicon conductor lines crossing sharp island edges generate leakage currents after reasonably high dosage irradiation, typically on the order of 100 to 200 KRad.

Consequently, there has heretofore existed a need for an improved method of manufacturing radiation hardened semiconductor devices that provide radiation hardened devices operating at relatively high dosage levels, on the order of 10 MRads, for example. Furthermore, it would be an advantage to provide an improved method of manufacturing radiation hardened semiconductor devices that embodies the advantages of both the bulk and silicon on insulator (SOI) methods while simultaneously obviating the disadvantages thereof.

SUMMARY OF THE INVENTION

Broadly, the invention is a method of manufacturing high speed, low leakage, radiation hardened semiconductor devices. In accordance with the method a SIMOX (separation by ion implantation of oxygen) wafer is masked with a separation mask to form the islands. This provides for N- and P-channel device separation and prevents device latch-up. N- and P-well implants are controlled and adjusted to to determine device turn-on voltages. The use of SIMOX substrate materials provides the benefits of improved radiation hardness due to its intrinsic oxide isolation and shallow wells and source and drain junctions. A relatively thin gate oxide layer is formed over the islands, and the island edges are covered with phosphoroborosilicate glass densified at a relatively low temperature (850°) to eliminate sharp island edges and hence edge leakage. These two features provides for stable field behavior after irradiation. The method produces radiation hardened devices that exhibit high speed and reliability and which are stable when irradiated with up to a 10 MRad dosage level.

In particular, the method comprises the following steps. A silicon on insulator substrate is provided, typically comprising a SIMOX wafer. The substrate is masked with a separation mask that defines silicon islands thereon, and the masked substrate is etched to form the silicon islands. The silicon islands are then oxidized to form a relatively thin oxide layer thereover. Predetermined ones of the silicon islands are masked and P-wells are formed, and then the remainder of the silicon islands are masked and N-wells are formed. A glass layer typically comprising phosphoroborosilicate glass is deposited and densified over the thin oxide layer and the surface of the substrate. The glass layer is masked and etched to form active areas within the silicon islands, such that the glass and thin oxide layers are disposed over the edges of the islands. The thin oxide layer and glass layer are radiation hard. In particular, in a fully fabricated device, holes generated across the field oxide layer are compensated for by electrons trapped between the glass layer and the thin oxide layer.

A gate oxide layer is then formed over the active areas. Polysilicon interconnects are formed that couple to the gate oxide layer of each active area. An oxide layer is then formed on the surface of the fabricated polysilicon interconnects. An N+ mask is deposited and dopant ions comprising phosphorus or arsenic are implanted into the unmasked portions of the substrate to form source and drain regions in P-well active areas. A P+ mask is deposited and dopant ions comprising boron are implanted into the unmasked portions of the substrate to form source and drain regions in N-well active areas. A second glass layer is then deposited over the substrate which forms a single relatively thick glass layer. The relatively thick glass layer is then heated to a predetermined relatively low temperature to reflow it. The relatively thick glass layer is masked and etched to form contact locations to source and drain regions of the active areas. Finally, conductive metalization is deposited over the surface of the wafer and conductive interconnects are formed that contact the source and drain regions of the fabricated devices by way of the contact locations.

It is therefore an advantage of the invention to provide an improved method of manufacturing high speed, low leakage, radiation hardened semiconductor devices. Another advantage of the invention is to provide a method of manufacturing high speed, low leakage, radiation hardened semiconductor devices that utilizes a combination of bulk silicon device fabrication steps and SIMOX device fabrication steps to obtain the benefits and obviate the disadvantages of both.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
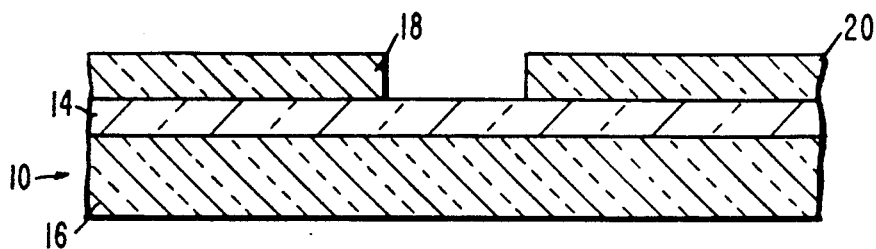
FIGS. 1-9 are diagrams illustrating the sequential steps of the method of the present invention.

Referring first to FIG. 1, there is shown a separation by ion implantation of oxygen (SIMOX) wafer 10 that comprises a base or substrate layer 16 of silicon (Si), an internal layer 14 of silicon oxide (SiO$_2$) that is on the order of 3600 Angstroms thick, and a top layer 12 of silicon that is on the order of 2400 Angstroms thick. In accordance with the present method, the SIMOX wafer 10 is coated with a photoresist material (not shown in FIG. 1), and the photoresist material is exposed utilizing a separation mask 11, shown in FIG. 10. The separation mask 11 divides the silicon layer 12 into a plurality of areas, herein referred to as islands 18, 20, utilizing conventional photomasking methodology. The SIMOX wafer 10 is etched to form the individual silicon islands 18, 20. This enables separation of subsequently produced N- and P-channel devices to eliminate PNPN silicon controlled rectifier effects. The islands 18, 20 also function as target alignment marks for subsequent mask alignments. Alternatively, separate alignment marks may be provided in the first masking and etching step to provide for subsequent mask alignment marks.

Figure 2:
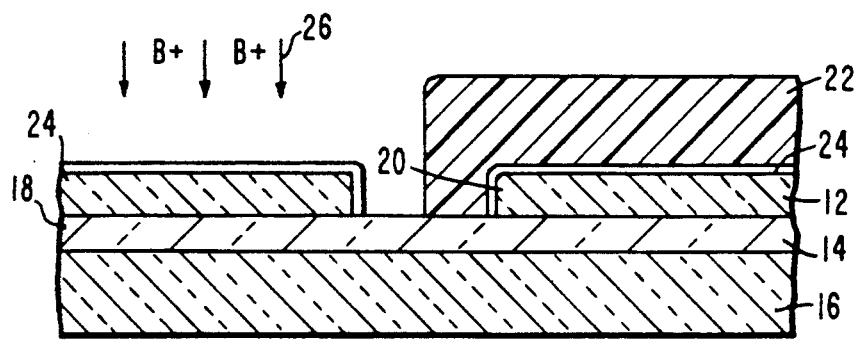

Referring now to FIG. 2, the wafer 10 is thermally oxidized to provide a 500 Angstrom thin oxide layer 24 on the silicon islands 18, 20. The wafer 10 is coated with a photoresist material 22, masked, and exposed in conventional manner, and the photoresist material 22 is selectively removed to expose P-well regions comprising the silicon islands 18. The P-well regions are implanted with boron (B+) ions in a conventional manner as indicated by arrows 26.

Figure 3:
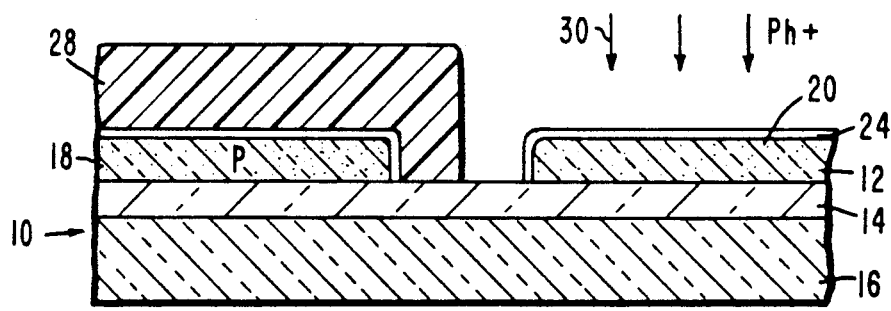

Referring now to FIG. 3, the wafer 10 is again coated with a photoresist material 28 and processed using conventional methods to expose the N-well regions comprising the silicon islands 20. The exposed N-well regions are implanted with phosphorus (Ph) ions as indicated by arrows 30. It should be observed that the P-well and N-well implants are adjusted in accordance with known methods to control transistor and field inversion threshold voltages of the subsequently formed devices.

Figure 4:
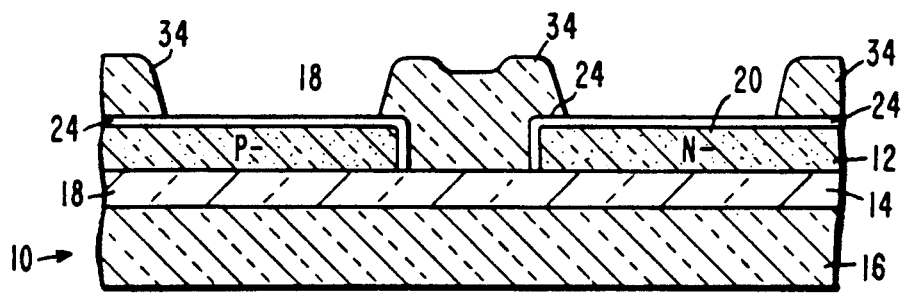

Referring now to FIG. 4, a 5,000 to 6,000 Angstrom layer of phosphoroborosilicate glass 34 is vapor deposited onto an upper surface of the wafer 10. The wafer 10 is then coated with a suitable photoresist material (not shown), and an active area mask (not shown) is used to selectively expose the photoresist material. The photoresist material is selectively removed and the layer of phosphoroborosilicate glass 34 is etched to expose the P- and N-well regions that comprise the active areas of the silicon islands 18, 20. It should be understood that layer of phosphoroborosilicate glass 34 overlaying the thin oxide layer 24 are radiation hard. This is because holes generated across the subsequently formed field oxide layer are compensated for by electrons trapped between the layer of phosphoroborosilicate glass 34 and thin oxide layer 24. This step effectively provides stable bulk silicon devices that remain stable when irradiated with up to a 10 MRad radiation dose.

Figure 5:
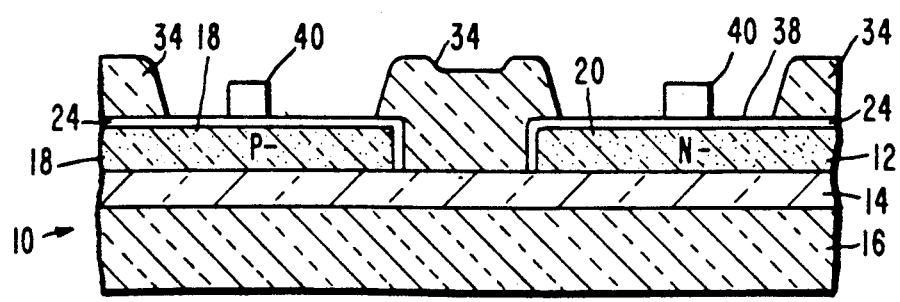

With reference to FIG. 5, a relatively thin gate oxide layer 38, having a thickness of approximately 200 Angstroms, is grown in the active area locations of the islands 18, 20. A layer of polysilicon is then deposited over the surface of the wafer 10. Phosphorus ions are then diffused into the polysilicon to form a conductive polysilicon layer. The conductive polysilicon layer is then masked and etched to form polysilicon gates 40 disposed on the thin oxide layer 38 that forms the gate oxide layer. This produces in the structure shown in FIG. 5.

Figure 6:
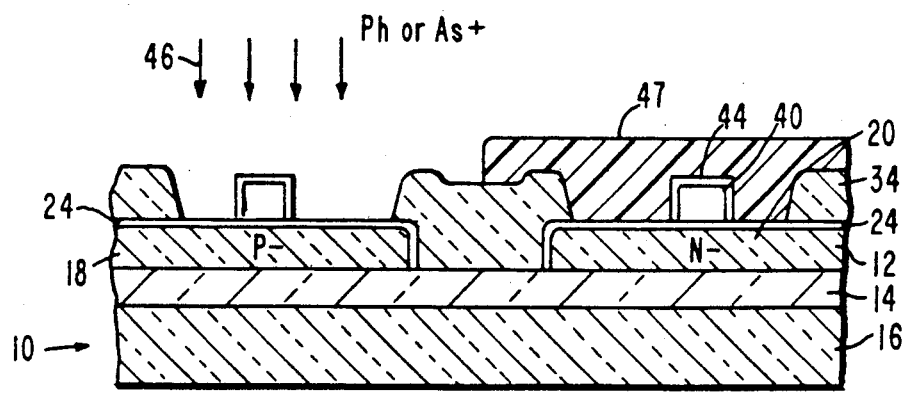

Referring now to FIG. 6, the polysilicon gates 40 are oxidized to provide a relatively thin oxide layer 44 thereover, having a thickness of about 600 Angstroms. The wafer 10 is coated with photoresist material 47 which is deposited, masked and selectively removed, and the wafer 10 implanted with phosphorus (Ph) or arsenic (As) ions in exposed active area locations of the islands 18 indicated by arrows 46. This forms the desired N+ source and drain regions 48 shown in FIG. 7.

Figure 7:
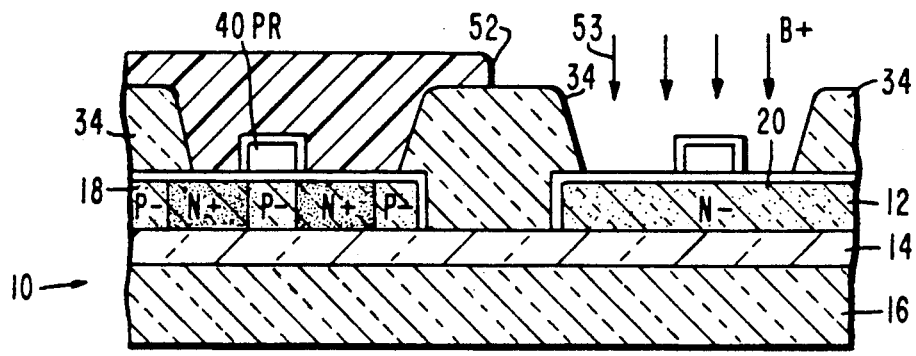

Referring now to FIG. 7, the process steps of FIG. 6 are repeated, but in this case a photoresist material 52 is deposited, masked and removed to expose the desired P+ active areas. The P+ active areas are formed by implanting boron (B+) ions into the exposed active areas indicated by arrows 53. This forms the desired P+ source and drain regions 54 shown in FIG. 8.

Figure 8:
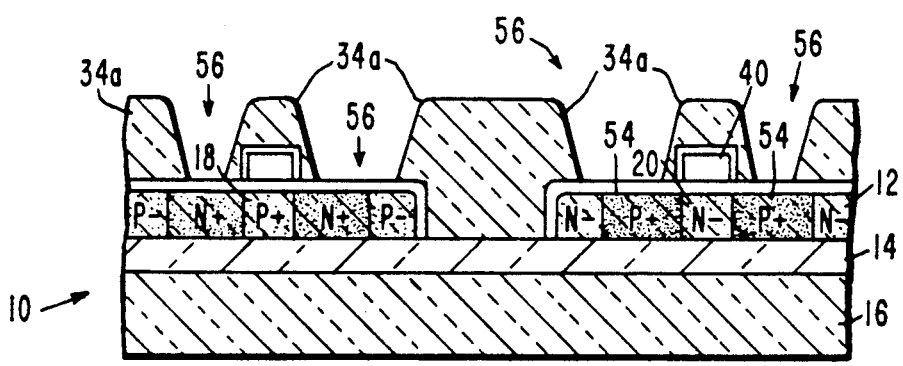

Referring to FIG. 8, a second layer of phosphoroborosilicate glass 34 deposited over the device structure shown in FIG. 7. The second layer of phosphoroborosilicate glass 34a is then reflowed by heating it to a predetermined relatively low temperature for a predetermined time period. Typically this is on the order of 850° Celsius for a period of twenty minutes. A contact mask is formed over the reflowed layer of phosphoroborosilicate glass 34a and it is etched to provide contact locations 56.

Figure 9:
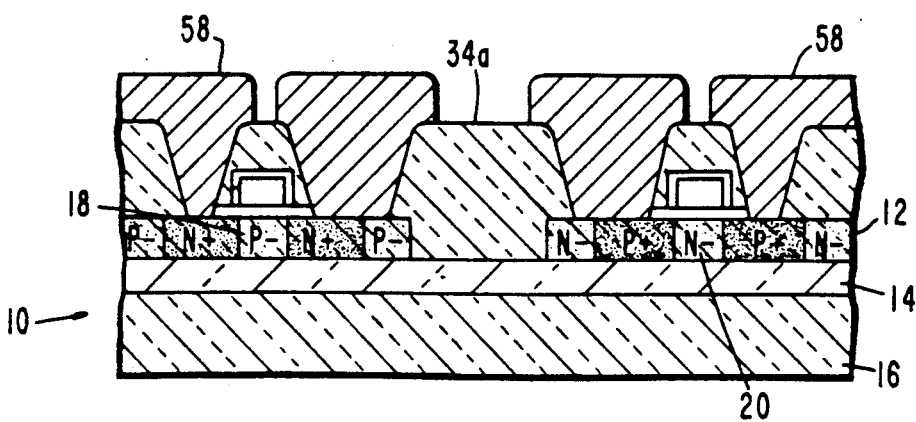

Referring now to FIG. 9, the final step in the process comprises the deposition of a conductive layer 58, comprising a material such as aluminum, onto the upper surface of the wafer 10 and selectively masking and etching the conductive layer 58 to provide contacts that provide for interconnection to external devices and circuits.

Figure 10:
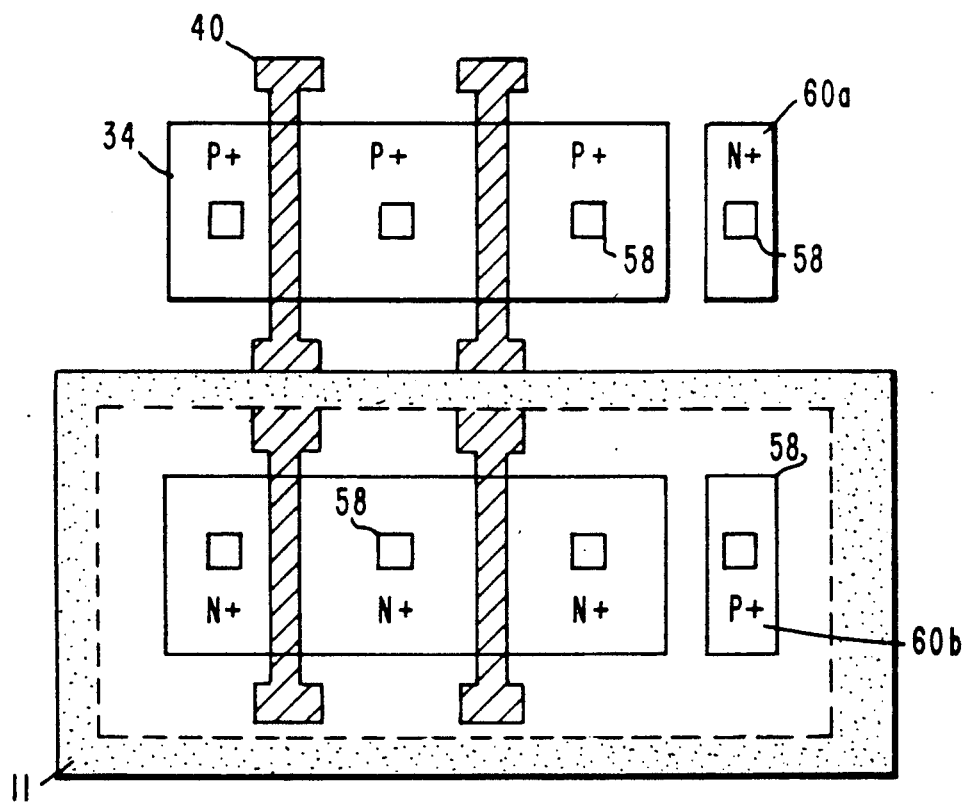
FIG. 10 is a top view of a typical semiconductor device substrate tie-down design produced in accordance with the invention.

A top view of a selected small area of a structure produced in accordance with the method of the present invention and showing a typical substrate tie-down structure is shown in FIG. 10. FIG. 10 shows the separation mask 11, N-well P-well tie downs 60a, 60b, P-well regions, contacts formed from the conductive layer 58, areas comprising phosphoroborosilicate glass 34, and the polysilicon gates 40, and the like, are shown in some detail.

From the above detailed description of the method of the present invention, it will be seen that the method employs separation mask processing steps typical of bulk silicon or silicon on insulator methods to provide a multiplicity of device islands. Subsequent steps in the method employ SIMOX steps to form the active semiconductor devices. In conjunction with these steps, the use of a relatively thin oxide layer and phosphoroborosilicate glass layers reflowed at relatively low temperatures on the order of 850° centigrade, for example, provide the benefits of both bulk silicon and SIMOX processing steps that result in fabrication of low leakage, radiation hardened semiconductor devices.

Thus there has been described a new and improved method of manufacturing high speed, low leakage, radiation hardened semiconductor devices. The method utilizes a combination of bulk silicon device fabrication steps and SIMOX device fabrication steps to obtain the benefits and obviate the disadvantages of both. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A method of manufacturing low leakage, radiation hardened semiconductor devices, said method comprising the steps of:
   providing a silicon on insulator substrate;
   masking a substrate with a separation mask that defines silicon islands thereon;
   etching the masked substrate to form the silicon islands;
   oxidizing the silicon islands to form a relatively thin oxide layer thereover;
   masking predetermined ones of the silicon islands and forming P-wells therein;
   masking the remainder of the silicon islands and forming N-wells therein;
   depositing a glass layer over the thin oxide layer and the surface of the substrate;
   masking and etching the glass layer to form active areas within the silicon islands, and such that the glass and thin oxide layers are disposed over the edges of the islands;
   disposing a gate oxide layer over the each of the active areas;
   fabricating polysilicon gates and interconnects that are coupled to the gate oxide layer of each active area;
   forming an oxide layer on the fabricated polysilicon gates and interconnects;
   forming an N+ mask and implanting dopant ions into the unmasked portions of the substrate to form source and drain regions in P-well active areas;
   forming a P+ mask and implanting dopant ions into the unmasked portions of the substrate to form source and drain regions in N-well active areas;
   depositing a second glass layer over the surface of the substrate;
   heating the glass layers to a predetermined relatively low temperature to reflow the layers;
   masking and etching the glass layers to form contact locations to source and drain regions of the active areas; and
   depositing conductive metalization over the surface of the wafer and etching conductive interconnects that contact the source and drain regions of the devices fabricated therein.

2. The method of claim 1 wherein the step of providing a silicon on insulator substrate comprises the step of providing a substrate having two outer layers of silicon separated by a silicon oxide layer fabricated by means of a separation by ion implantation of oxygen process.

3. The method of claim 1 wherein the step of masking the silicon islands and forming P-wells therein comprises the steps of:
   providing a P-well mask covering predetermined ones of the silicon islands; and
   implanting boron ions into the unmasked silicon islands to form N-wells.

4. The method of claim 1 wherein the step of masking the silicon islands and forming N-wells therein comprises the steps of:
   providing an N-well mask covering the remainder of the silicon islands; and
   implanting phosphorus ions into the unmasked silicon islands to form N-wells.

5. The method of claim 1 wherein the step of depositing a glass layer over the thin oxide layer comprises the step of depositing a phosphoroborosilicate glass layer over the thin oxide layer.

6. The method of claim 1 wherein the step of fabricating polysilicon gates and interconnects comprises the steps of:
   depositing a layer of polysilicon over the substrate;
   diffusing dopant ions into the layer of polysilicon to provide a doped polysilicon layer;
   masking the doped polysilicon layer; and
   etching the doped polysilicon layer to form the polysilicon gates and interconnects.

7. The method of claim 1 wherein the step of forming an N+ mask and implanting dopant ions comprises the steps of:
   forming a photoresist mask over the N-well regions of the substrate;
   implanting phosphorus or arsenic ions into the unmasked portion of the wafer; and
   removing the photoresist mask.

8. The method of claim 1 wherein the step of forming an P+ mask and implanting dopant ions comprises the steps of:
   forming a photoresist mask over the P-well regions of the substrate;
   implanting boron ions into the unmasked portion of the wafer; and
   removing the photoresist mask.

9. The method of claim 3 wherein the step of masking the silicon islands and forming P-wells comprises controlling the implantation of the boron ions to adjust N-channel transistor and field inversion threshold voltages.

10. The method of claim 4 wherein the step of masking the silicon islands and forming N-wells comprises controlling the implantation of the phosphorous ions to adjust P-channel transistor and field inversion threshold voltages.

11. The method of claim 1 wherein the step of oxidizing the silicon islands to form a relatively thin oxide layer thereover comprises controlling the oxide growth to provide a gate oxide layer of about 200 Å thickness.

12. The method of claim 1 wherein the step of masking and etching the glass layers to form contact locations to source and drain regions of the active areas comprises the step of forming a contact mask and etching the glass layers.

13. A method of manufacturing low leakage, radiation hardened semiconductor devices, said method comprising the steps of:
   providing a silicon on insulator substrate fabricated by means of a separation by ion implantation of oxygen process;
   masking a substrate with a separation mask that defines silicon islands thereon;
   etching the masked substrate to form the silicon islands;
   oxidizing the silicon islands to form a relatively thin oxide layer thereover;
   masking predetermined ones of the silicon islands and forming P-wells therein;
   masking the remainder of the silicon islands and forming N-wells therein;
   depositing a phosphoroborosilicate glass layer over the thin oxide layer and the surface of the substrate;
   masking and etching the phosphoroborosilicate glass layer to form active areas, such that the phosphoroborosilicate glass and thin oxide layers are disposed over the edges of the islands;

disposing a gate oxide layer over the active areas;

fabricating polysilicon gates and interconnects that are coupled to the gate oxide layer of each active area;

forming an oxide layer on the fabricated polysilicon gates and interconnects;

forming an N+ mask and implanting dopant ions into the unmasked portions of the substrate to form source and drain regions in P-well active areas;

forming a P+ mask and implanting dopant ions into the unmasked portions of the substrate to form source and drain regions in N-well active areas;

depositing a second phosphoroborosilicate glass layer over the surface of the substrate;

heating the phosphoroborosilicate glass layers to a predetermined relatively low temperature to reflow the phosphoroborosilicate glass layers;

masking and etching the phosphoroborosilicate glass layers to form contact locations to source and drain regions of the active areas; and depositing conductive metalization over the surface of the wafer and etching conductive interconnects that contact the source and drain regions of the devices fabricated therein.

14. The method of claim 13 wherein the step of masking the silicon islands and forming P-wells therein comprises the steps of:

providing a P-well mask covering selected ones of the silicon islands; and implanting boron ions into the unmasked silicon islands to form N-wells.

15. The method of claim 14 wherein the step of masking the silicon islands and forming N-wells therein comprises the steps of:

providing an N-well mask covering the remainder of the silicon islands; and implanting phosphorus ions into the unmasked silicon islands to form N-wells.

16. The method of claim 15 wherein the step of fabricating polysilicon gates and interconnects comprises the steps of:

depositing a layer of polysilicon over the substrate;

diffusing dopant ions into the layer of polysilicon to provide a doped polysilicon layer;

masking the doped polysilicon layer; and etching the doped polysilicon layer to form the polysilicon gates and interconnects.

17. The method of claim 16 wherein the step of forming an N+ mask and implanting dopant ions comprises the steps of:

forming a photoresist mask over the N-well regions of the substrate;

implanting phosphorus or arsenic ions into the unmasked portion of the wafer; and removing the photoresist mask.

18. The method of claim 17 wherein the step of forming an P+ mask and implanting dopant ions comprises the steps of:

forming a photoresist mask over the P-well regions of the substrate;

implanting boron ions into the unmasked portion of the wafer; and removing the photoresist mask.

19. The method of claim 14 wherein the step of masking the silicon islands and forming P-wells comprises controlling the implantation of the boron ions to adjust transistor and field inversion threshold voltages.

20. The method of claim 15 wherein the step of masking the silicon islands and forming N-wells comprises controlling the implantation of the phosphorous ions to adjust transistor and field inversion threshold voltages.

* * * * *